United States Patent [19]

Kikuchi et al.

[11] Patent Number: 5,018,145
[45] Date of Patent: May 21, 1991

[54] IC TESTER

[75] Inventors: Shuji Kikuchi, Kanagawa; Yoshio Ouchida; Ryohei Kamiya, both of Honjo, all of Japan

[73] Assignees: Hitachi, Ltd.; Hitachi Electronics Engineering Co., Ltd., both of Tokyo, Japan

[21] Appl. No.: 401,228

[22] Filed: Aug. 31, 1989

[30] Foreign Application Priority Data

Sep. 6, 1988 [JP] Japan ............................. 63-221290

[51] Int. Cl.$^5$ ............................................. G06F 11/22
[52] U.S. Cl. ...................................................... 371/27
[58] Field of Search .................... 371/27, 25.1, 22.1, 371/15.1; 324/73 R, 73.1

[56] References Cited

U.S. PATENT DOCUMENTS 4,670,879 6/1987 Okino .................................... 371/27
4,759,021 7/1988 Kawaguchi ........................... 371/27
4,797,886 1/1989 Imada ................................... 371/27

FOREIGN PATENT DOCUMENTS 57-111471 7/1982 Japan .

OTHER PUBLICATIONS

1980 IEEE Test Conference article, "100 MHz Algorithmic Pattern Generator for Memory Testing", by Masao Shimizu, et al., pp. 56-67.

Primary Examiner—Clark A. Jablon
Assistant Examiner—Robert W. Beausoliel
Attorney, Agent, or Firm—Kenyon & Kenyon

[57] ABSTRACT

To speed up the pattern generator which is a bottleneck for speedup of an LSI tester, a continuous address control information for generating addresses for continuous pattern memory read is generated at a speed 1/N (N is an optional number larger than 1) times the operation speed of the continuous address generator, and the address controller is divided into a 1st and a 2nd address controller. The two controllers are connected via a buffer memory to ensure the normal operation when the correspondence between address control instructions and patterns to be continuously read is not 1:N. Continuous address information generated by the 1st address controller is stored in the buffer memory. The second address controller, which actually generates continuous addresses, receives the continuous address information from the buffer memory, outputs the addresses to the pattern memory at a speed N times of the operation speed of the 1st address controller, and receives the next continuous address information from the buffer memory once again when the continuous address generation is finished to repeat the operation mentioned above.

6 Claims, 4 Drawing Sheets

FIG. 2(b)

| COMPRESSED ADDRESS | INSTRUCTION | CORRESPONDING LOCATION |
|---|---|---|
| 0 | JUMP 9 (2) | at 5 |
| 1 | END | at 8 |
| 2 | JUMP 6 (1) | at 11 |

INSTRUCTION — OPERAND — COMPRESSED OPERAND

FIG. 2(a)

| ADDRESS | INSTRUCTION |
|---|---|
| 0 | NOP |
| 1 | NOP |
| 2 | NOP |
| 3 | NOP |
| 4 | NOP |
| 5 | JUMP 9 |
| 6 | NOP |
| 7 | NOP |
| 8 | END |
| 9 | NOP |
| 10 | NOP |
| 11 | JUMP 6 |

INSTRUCTION — OPERAND

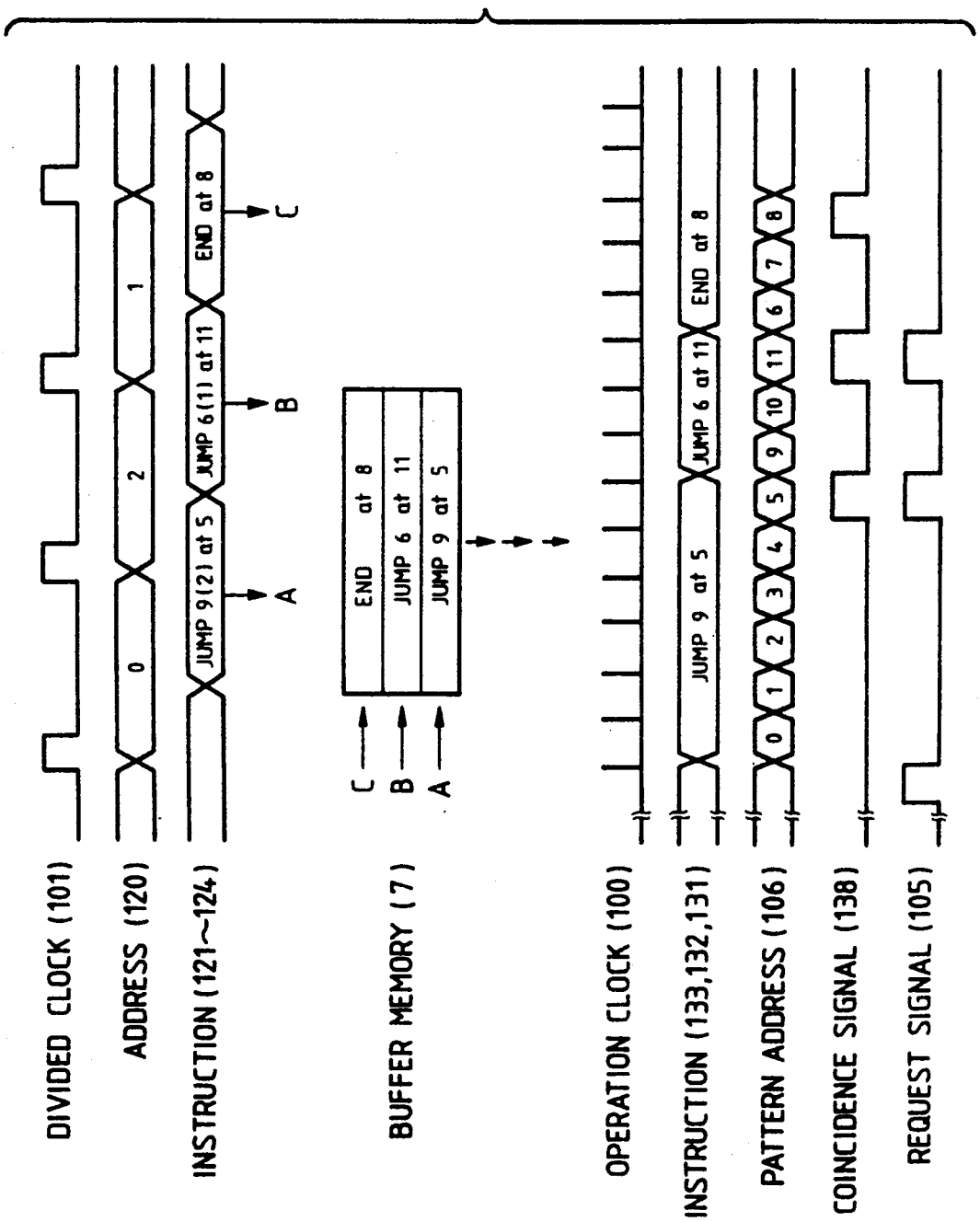

IC TESTER

BACKGROUND OF THE INVENTION

1. Field of the Invention

The present invention relates to an IC tester. In particular, the present invention is directed to a tester which is suited for quick generation of a long LSI test pattern.

2. Description of the Related Art

An LSI tester consists of (1) a pattern generator which generates input patterns to be given to an input pin of an LSI under test and expected patterns for comparison with the value of the output pin, (2) a timing generator which generates the timing to give the input patterns mentioned above and the timing for comparison with the expected patterns mentioned above, (3) a wave formatter which formats a digital wave used for the test using the patterns and timing generated from the generators mentioned above, and (4) a comparator which compares the output patterns of the LSI under test and the expected patterns.

The pattern generator stores the input patterns and expected patterns in the memory beforehand, and reads and generates the patterns when the test is to be executed. The tester is equipped with an address controller which controls reading of the memory for repetitive generation of the same pattern or for generation of a pattern jump. The memory stores the patterns as well as address control instructions to generate complicated patterns.

There is an increasing demand for increased speed of such an LSI tester as mentioned above, especially a pattern generator due to high speed operation of semiconductors. Japanese Patent Laid-Open 1982-111471, "Test Pattern Generator" is associated with this demand.

In this generator, the test patterns and the address control instructions are stored in independent memories, and the patterns are read in more than one cycle during execution of one address control instruction. The memory storing the address control instructions and the address controller (program counter) are provided with a 1/N divided clock. Access to the memory storing the patterns is made by the address generated by the address controller and an address, to the lower part of which the output of the base N counter is set. During execution of one address control instruction, the base N counter generates the lower part from 0 to N-1 of an address to read the patterns. By doing this, patterns can be generated at a speed N times of the operation speed of the address controller.

The conventional method mentioned above has a disadvantage in that the number of patterns to be read by one address control instruction is fixed to 1:N and pattern read cannot be optionally controlled or pattern read is restricted considerably, causing a limit to speedup of pattern read.

SUMMARY OF THE INVENTION

The purpose of the present invention is to solve the problem mentioned above and to achieve reading of patterns at a high speed without causing a limit to the pattern read control. The IC tester of the present invention, which tests ICs with test patterns, is equipped with (1) a first memory to store the test pattern control instructions, (2) a first address generator to specify the instruction addresses, (3) a second memory to store the test patterns, (4) a second address generator to specify the pattern addresses, (5) a unit to control the first address generator by interpreting a control instruction read from the first memory and to output the control information of the second address generator, (6) a buffer memory to store the control information temporarily, and (7) a unit to control the second address generator according to the control information. The tester is featured by that the first address generator is lower in operation speed than the second address generator, another control information is output before the control information temporarily stored in the buffer memory is exhausted by generation of addresses more than once by the second address generator, and such control information is controlled so that it does not overflow the buffer memory.

The problem mentioned above is caused by N test patterns which are fixed to be continuously read during execution of one address control instruction.

The number of patterns continuously read in the test is not fixed, and the number of continuous patterns should be controlled each time in the realtime for pattern generation. For example, such control is required that continuous 20 patterns are read after the address control instruction is executed, then 4 continuous patterns from the jumped address are read. In this case, reading of patterns at a high speed cannot be achieved by changing the number of clock divisions to be given to the address controller or the base N counter for the lower part of each address to be used to read patterns using the conventional method. This is because, during execution of one address control instruction, N or more patterns are not always read or only one pattern may be read for one address control instruction. If the worst comes to the worst, each pattern is read and the address control instruction is executed in each cycle. As a result, patterns cannot be generated at a speed N times of the operation speed of the address controller (this is an effect of the conventional method).

To achieve speedup of pattern read in the present invention, for example, each address control instruction is always executed by a 1/N clock (or an operation clock N), and the pattern memory is read by the operation clock N (or a N fold clock). The address controller is divided into two parts by execution of one address control instruction, a part where continuous address specification information is generated and a part where the continuous addresses are actually generated by this information. Connection of the two parts via a buffer memory allows limitless pattern read.

The address controller of the pattern generator, which is a bottleneck for speedup of the LSI tester, is operated by a 1/N clock (or an operation clock N) in the present invention, and the pattern memory is read at a speed N times of the operation speed of the address controller, causing patterns to be generated at a high speed. The address controller is divided into two parts and both parts are connected via a buffer memory as mentioned above, so that the correspondence between address control instructions and patterns to be continuously read is not necessary to be 1:N. The continuous address information generated by the first address controller is stored in the buffer memory. The second address controller, which generates continuous addresses, receives the continuous address information from the buffer memory, and outputs the addresses to the pattern memory at a speed N times of the operation speed of the first address controller. When the continuous addresses are all generated, the second address controller receives the next continuous address information from the buffer memory, and repeats the operation indicated above. The continuous address information is written into the buffer memory at a speed equal to 1/N of the speed of the operation clock. The cycle for reading of the continuous address information is not fixed, sometimes long or short. Before starting generation of patterns, the buffer memory can be filled with information by executing the address control instruction. By doing this, when the correspondence indicated above is 1:N or higher on the average, the operation indicated above can be performed even if the number of continuous addresses corresponding to the address control instruction is changed. The foregoing and other objects, advantages, manner of operation and novel features of the present invention will be understood from the following detailed description when read in connection with the accompanying drawings.

BRIEF DESCRIPTION OF THE DRAWINGS

FIGS. 2(a) and 2(b) illustrate a program conversion in the present invention.

FIG. 4 illustrates the operation of the present invention with the configuration in FIG. 3.

DETAILED DESCRIPTION OF THE PREFERRED EMBODIMENTS

Descriptions of embodiments of the present invention follow.

Figure 1:
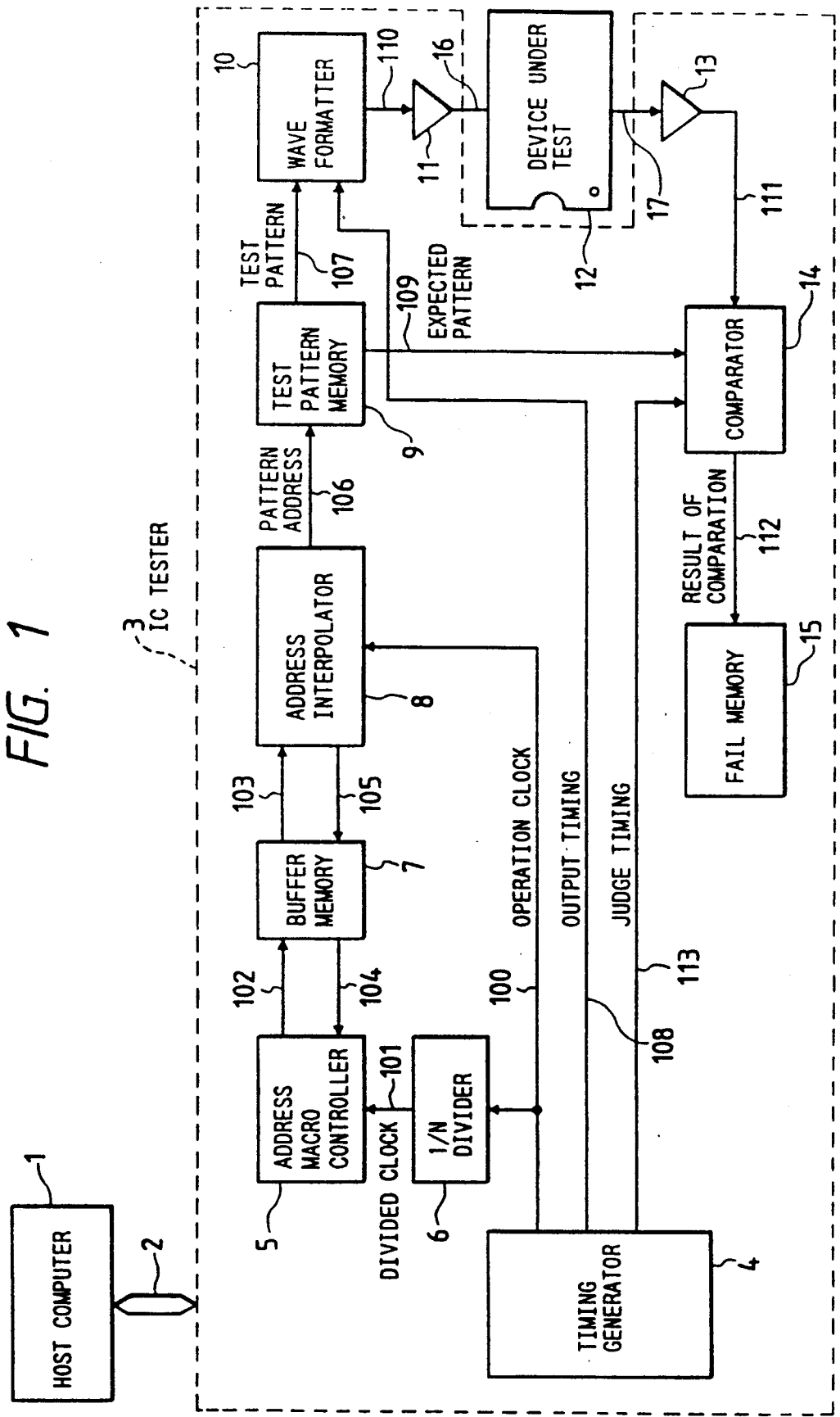
FIG. 1 shows a block diagram of an embodiment of the present invention.

FIG. 1 shows a block diagram of an embodiment of the IC tester of the present invention. IC tester 3 includes (1) test pattern memory 9 which stores test pattern 107 to specify test signal 16 to be output to a device (IC) 12 under test (memory IC, LSI, etc.) and expected pattern 109 to specify output signal 17 to be expected when the test pattern (107) is output; (2) timing generator 4 which generates output timing 108 for test wave 16 and judge timing 113 to compare output wave 111, described later, with the expected pattern (109); (3) wave formatter 10 which formats test wave 110 in output timing 108 according to test pattern 107; (4) comparator 14 which compares expected pattern 109 with output pattern 111 from IC12 under test; and (5) fail memory 15 which stores comparison result 112.

Driver 11 in FIG. 1 converts test wave 110 formatted on the logical level to one on the actual voltage level and generates test signal 16 to be output to IC 12 under test. Receiver 13 receives output signal 17 from IC 12 under test and converts it to output wave 111 on the logical level.

The portion of IC tester 3, which requires a longest operation time, is a portion where pattern address 106 to be used to read test pattern 107 is generated. This portion of the present invention consists of, for example, (1) address macro controller 5 which outputs information 102 to specify continuous addresses in batches, (2) 1/N divider 6 which divides operation clock 100 to 1/N and outputs it to the address macro controller, (3) buffer memory 7 which stores information 102 temporarily, and (4) address interpolator 8 which receives information 102 from buffer memory 7 and interpolates and generates a series of addresses (pattern address 106), specified in batches, every cycle.

Descriptions of the operations follow.

A pattern control program, which consists of a series of address control instructions, is written into address macro controller 5 via bus 2 from host computer 1 beforehand. The test pattern is written into test pattern memory 9 and the timing data into timing generator 4. Before starting the test, timing generator 4 outputs operation clock 100. 1/N divider 6 divides it to generate divided clock 101. If this occurs, address macro controller 5 executes the program, which is written beforehand, and outputs address macro information 102, which specifies a series of addresses, to buffer memory 7 successively. When filled with information 102, buffer memory 7 outputs pause signal 104 to stop address macro controller 5.

The test starts in this state.

Address interpolator 8 outputs request signal 105 according to operation clock 100 to receive address macro information 103 from buffer memory 7, and interpolates it to output pattern address 106. When the interpolation is finished, the address interpolator outputs request signal 105 once again to receive the next address macro information (103), then outputs pattern address 106.

Test pattern memory 9 reads data corresponding to pattern address 106 and outputs it as test pattern 107. The test pattern memory 9 outputs expected pattern 109 simultaneously. Wave formatter 10 outputs test wave 110 according to test pattern 107, and driver 11 converts it to test signal 16 and outputs it to IC 12 under test. Signal 17, which is output from IC 12 under test, is converted to output wave 111 by receiver 13 and output to comparator 14. Comparator 14 compares expected pattern 109, indicated above, with output wave 111 and obtains comparison result 12, which is stored in fail memory 14.

The address interpolator 8 receives address macro information 103 and an empty area is resultantly generated in buffer memory 7 which is initially filled with information. Then, buffer memory 7 stops outputting pause signal 104 to allow address macro controller 5 to enter the ready state once again.

Even when the operation correspondence between address macro controller 5 and address interpolator 8 is not 1:N, an empty area in buffer memory 7 can be increased or decreased to ensure the normal operation.

Address interpolator 8 outputs pattern address 106 successively without a pause. When one interpolation is finished, the address interpolator inputs the next address macro information. To allow the empty area in buffer memory 7, which is generated by address interpolator 8, to be filled with information, the buffer memory operates address macro controller 5 to furnish new address macro information 102 into the area. When the operation correspondence between address macro controller 5 and address interpolator 8 is less than 1:N (for example, 2), the address macro information stored in buffer memory 7 is decreased in quantity. If this state is continued, buffer memory 7 will be empty. Such a state is never continued in the test, and the ratio can be kept higher than 1:N if an appropriate value is selected for N. This means that the buffer memory will not be empty completely during the test though the empty area may be increased or decreased.

FIGS. 2(a) and 2(b) illustrate concrete operations using an actual control program.

FIG. 2(a) shows an example of conventional control programs. The NOP instruction directs to move to the next address. The JUMP instruction directs to jump to the address specified by the corresponding operand. When the program in FIG. 2(a) is executed, addresses 0, 1, 2, 3, 4, 5, 9, 10, 11, 6, 7, and 8 are generated in this order.

When this program is to be executed by the present invention, it should be converted first. FIG. 2(b) shows the converted program. In this conversion, addresses continuously generated are compressed to one address which corresponds to one control instruction. For example, addresses 0 to 5 in FIG. 2(a) are continuously generated by the NOP instruction; that is, an address in increments of 1 is generated one by one. Only one significant instruction of those which correspond to addresses 0 to 5 is "JUMP to 9" corresponding to address 5. The instructions corresponding to these addresses are compressed to one having the meaning that each address is incremented by one successively and when it reaches address 5, the instruction "JUMP to 9" is executed. FIG. 2(b) shows NOP instructions which are compressed to one instruction other than NOP, which follows the said NOP instructions. Each instruction is provided with the address, which corresponds to it before compression, as a corresponding location. This information specifies the time of execution of the instruction. Each operand to be used for a jump instruction is additionally provided with a compressed operand to indicate the compressed address to the jump destination.

Figure 3:
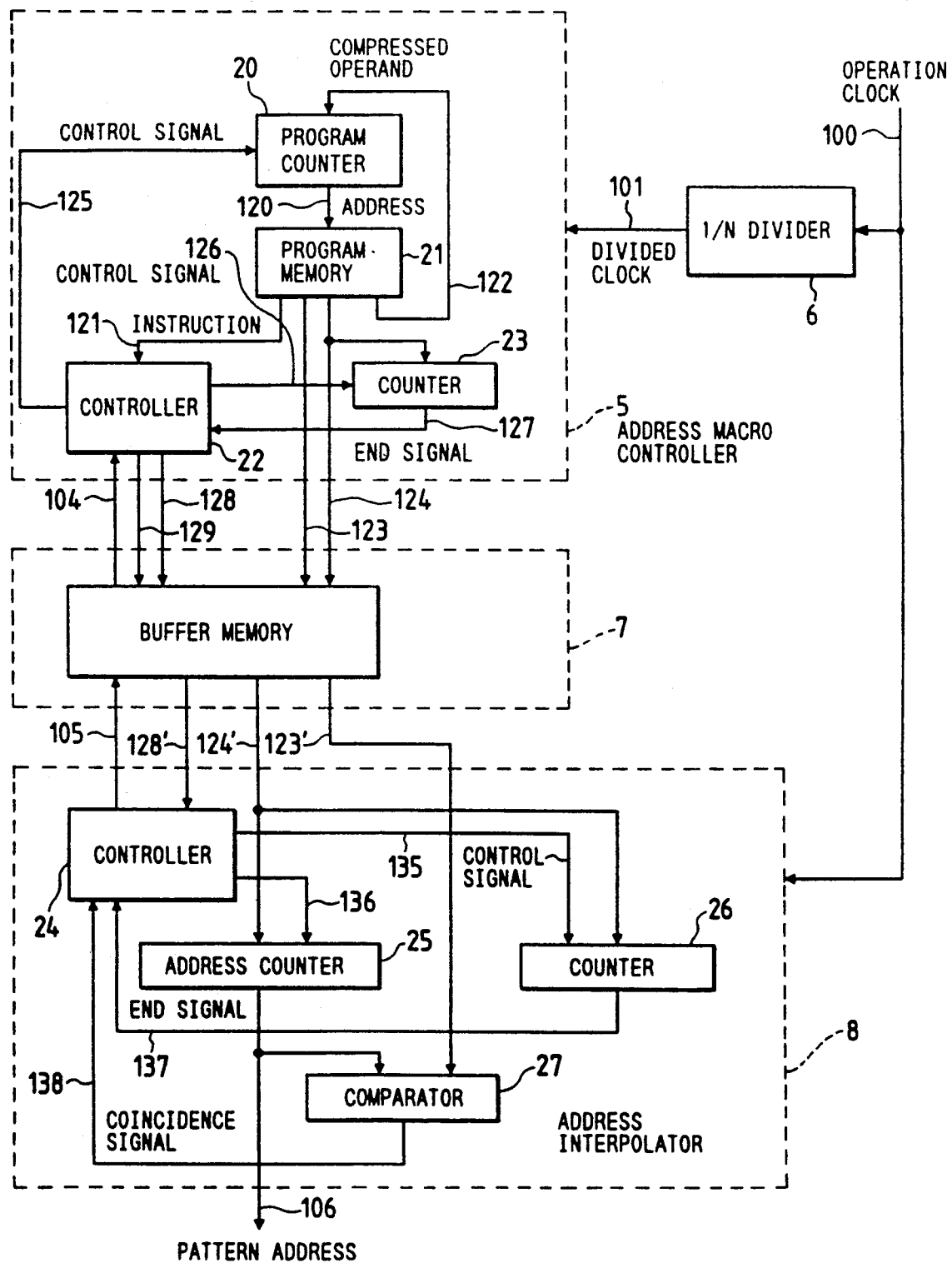
FIG. 3 shows a block diagram of a concrete example of the address controller of the present invention.

FIG. 3 shows a concrete configuration example of the hardware to be used to execute the program in FIG. 2(b). The figure details address macro controller 5, address interpolator 8, and buffer memory 7.

Address macro controller 5 consists of (1) program memory 21 which stores the control program, (2) program counter 20 which specifies the read address for the program memory, (3) controller 22 which interprets read control instruction 121 and outputs a necessary control signal, and (4) counter 23 which counts the repeat count of an instruction such as the LOOP instruction. In this example, an instruction is read from program memory 21 using address 120 which is output from program counter 20. Controller 22 interprets it. When it is found to be a jump instruction, the controller directs program counter 20 to read compressed operand 122 using control signal 125. When it is found to be a loop repeat instruction, the controller directs counter 23 to read operand 124 in the first cycle and to count down in the subsequent cycles. When it is found to be a loop instruction, the controller directs program counter 20 to read addresses when the repeat count is being counted. Then, when calculation end signal 127 is output from counter 23, the controller directs an addition of 1 to program counter 20, and repeats and escapes from the loop.

Address macro controller 5 outputs and writes address interpolation instruction 128, operand 124, and corresponding location 123 into buffer memory 7 using write control signal 129. When filled with information (no empty area), Buffer memory 7 outputs pause signal 104 to stop address macro controller 5.

Address interpolator 8 receives address interpolation instruction 128, operand 124, and corresponding location 123 from buffer memory 7, and generates interpolated addresses. Controller 24 directs an addition of 1 to address counter 25. When coincidence signal 138 is output from comparator 27 because address 106 indicated by address counter 25 matches corresponding address 123', controller 24 directs the control contents of address interpolation instruction 128' to address counter 25 using control signal 136. When instruction 128' is a jump instruction, control signal 136 directs to read the operand, and address counter 25 reads operand 124' in response to it, and executes a jump. Simultaneously, controller 24 outputs request signal 105 for the next address interpolation instruction to the buffer memory, and executes instructions without a pause.

When address interpolation instruction 128' is a repeat instruction, the controller holds address counter 25 when address counter 25 and corresponding address 123' match with each other. The controller loads the repeat count (operand 124) into counter 26 in the first cycle when the address match occurs, and directs the counter to count down in the subsequent cycles. When the counting is finished, counter 26 informs controller 24 of it by outputting end signal 137. Controller 24 releases the holding state of address counter 25, and directs an addition of 1 to generate the same address repeatedly.

FIG. 4 illustrates the operation of the hardware shown in FIG. 3 when the program in FIG. 2(b) is executed. This figure is referred to in the following description of the work of the program. The program in FIG. 2(b) is to be stored in program memory 21 in FIG. 3 beforehand. Program counter 20 outputs address 0 according to the first divided clock (101), and the instruction (121 to 124) "JUMP 9(2) at 5" corresponding to the address is read from program memory 21. Controller 22 outputs write signal 129 to buffer memory 7 to store in "JUMP 9 at 5". Controller 22 directs program counter 20 to fetch the compressed address. The value of program counter 20 is updated to 2 according to the next clock (101). Then, the instruction (121 to 124) "JUMP 6(1) at 11" corresponding to address 2 is read from program memory 21, and buffer memory 7 stores the codes other than the compressed operand by write signal 129 from controller 22. Controller 22 directs program counter 20 to fetch the compressed address once again, and the address is updated to 1 according to the next clock (101). The instruction "END at 8" corresponding to the address is read in the same way, and stored in buffer memory 7. Controller 22 detects the END instruction (End signal 127), stops its operation, and ignores the next clock (101).

The test starts in this state. At the beginning of the operation, request signal 105 is output. The first instruction "JUMP 9 at 5", which is stored in buffer memory 7 according to operation clock 100 shown at the lower part of FIG. 4, is read. Assuming that the initial value of address counter 25 is 0, the value of address counter 25 does not match corresponding location 123', and controller 24 directs an addition of 1 to address counter 25 using control signal 136. By this instruction, pattern address 106 is incremented by 1 sequentially and updated to 0, 1, 2, 3, and 4. When the address reaches 5 by an addition of 1, comparator 27 detects that the address matches corresponding location 123' and outputs coincidence signal 138 to controller 24. Controller 24 directs address counter 25 to fetch operand 124' and outputs request signal 105 to buffer memory 7 simultaneously. Address counter 25 fetches the operand according to the next clock (100) and updates the value to 9. By doing this, a new instruction "JUMP 6 at 11" is read from buffer memory 7. However, the value of address counter 25 does not match corresponding location 123', and controller 24 directs an addition of 1 to address counter 25. 1 is added to address counter 25 whenever clock 100 is input and the value is updated to 9, 10, and 11. Comparator 27 detects that the address matches corresponding location 123' and outputs coincidence signal 138 to controller 24. Controller 24 outputs control signal 136 to address counter 25, directs the counter to fetch operand 124', and outputs request signal 105 to buffer memory 7. Address counter 25 fetches operand 124' according to the next clock (100), and updates the value to 6. By doing this, the next instruction "END at 8" is read from buffer memory 7. Then, address counter 25 is incremented by 1 sequentially once again, and the value is updated to 7 and 8. The value matches corresponding location 123', and the operation ends.

A short program is used in the description above. When a program requiring a long execution time is used, buffer memory 7 may be full of information. If this occurs, pause signal 104 is output from buffer memory 7, and address macro controller 5 is stopped, though address interpolator 8 continues the operation. When an empty area is generated in buffer memory 7 because an instruction is read from the memory, pause signal 104 is released and address macro controller 5 restarts the operation.

In the operation example mentioned above, repeat control instructions for loop or repeat instructions are not described. The loop or repeat count is counted by counter 26 in FIG. 3 for an innermost loop instruction or a repeat instruction, or by counter 23 for an outer loop instruction. A series of repeat addresses counted by counter 26 is handled as a group, and address macro controller 5 executes the control instruction once.

The value for N of 1/N divider 6 in this embodiment is 4, though it can be specified appropriately according to the instruction execution frequency by address macro controller 5 so that buffer memory 7 does not become empty. The value for N may be designed to be constant or to be set in realtime using instruction 121.

Instead of the 1/N divider, a clock with a multiple frequency, which is N times of that of the clock of address macro controller 5, may be used as a clock of address interpolator 8. It is natural that the philosophy of the present invention is satisfied even if N is not an integer.

In this embodiment, a FIFO unit (MMI 67411A, etc.) is assumed to be used as buffer memory 7. However, two memory planes may be switched alternately so that, when one of them is reading data, another is writing data. In this case, an address counter to specify the addresses of the memory planes may be installed to detect that the address counter corresponding to the memory plane while reading reaches the maximum value (the writing starts at address 0) and to switch the memory plane. When the address counter corresponding to the memory plane while writing reaches the maximum value, a pause signal may be output to stop the writing.

In this embodiment, the hardware is structured so that pattern generation is controlled by controlling pattern memory read. However, the hardware may be structured so that pattern generation is controlled by a calculator and reading an instruction memory which stores control instructions for the calculator. In this case, the test patterns can be generated at a high speed.

In this embodiment, as mentioned above, the test patterns can be read at a speed several times of the operation speed of the address controller to control patter address read.

The present invention provides an advantage that reading the pattern memory, which stores the IC (LSI) test patterns, can be controlled at a speed several times of that of the conventional method without special restrictions.

What is claimed is:

1. An IC tester comprising:
    a first memory storing test pattern control instructions;
    a first address generator specifying addresses to said first memory;
    a second memory storing the test patterns;
    a second address generator specifying addresses to said second memory, said second address generator generating the addresses to said second memory at a speed higher than the speed said first address generator generates addresses;
    a first controller controlling said first address generator by interpreting a test pattern control instruction read from said first memory, and outputting control information for said second address generator;
    a third memory temporarily storing said control information; and
    a second controller controlling said second address generator by interpreting a control information read from said third memory.

2. The IC tester of claim 1 wherein, said IC tester is equipped with a divider which operates said first address generator with an operation clock divided to 1/N of that of said second address generator, where N is an integer greater than or equal to 2.

3. The IC tester of claim 1 wherein, said IC tester is equipped with a multiplying unit to operate said second address generator with an operation clock increased to N times that of said first address generator where N is an integer greater than or equal to 2.

4. The IC tester of claim 1, further comprising:
    a third controller inputting succeeding control information before the control information stored temporarily in said third memory is exhausted and stopping the input of the control information to said third memory when said third memory is filled.

5. An IC tester comprising:
    a first memory storing test pattern control instructions;
    a first address generator specifying addresses top said first memory;
    a second memory storing test patterns;
    a second address generator specifying addresses to said second memory;
    a first controller providing a first control signal to said first address generator by interpreting a test pattern control instruction read from said first memory, said first control signal being in accordance with the interpretation of said test pattern control instruction, and further providing a control information for said second address generator;
    a third memory temporarily storing said control information for said second address generator;
    a second controller providing a second control signal generated in accordance with an interpretation of the temporarily stored control information being read from said third memory; and
    a clock generator providing clock signals to said first and second address generators, and providing an address renewal speed to each of said address generators.

6. The IC tester of claim 5 wherein, said IC tester is equipped with a divider which operates said first address generator with an operation clock divided to 1/N of that of said second address generator where N is an integer greater than or equal to 2.

* * * * *